US007693928B2

(12) United States Patent
Stein et al.

(10) Patent No.: US 7,693,928 B2
(45) Date of Patent: Apr. 6, 2010

(54) GALOIS FIELD LINEAR TRANSFORMER TRELLIS SYSTEM

(75) Inventors: Yosef Stein, Sharon, MA (US); Haim Primo, Tikva (IL)

(73) Assignee: Analog Devices, Inc., Norwood, MA (US)

(*) Notice: Subject to any disclaimer, the term of this patent is extended or adjusted under 35 U.S.C. 154(b) by 960 days.

(21) Appl. No.: 10/753,301

(22) Filed: Jan. 7, 2004

(65) Prior Publication Data
US 2004/0210618 A1    Oct. 21, 2004

Related U.S. Application Data

(60) Provisional application No. 60/461,267, filed on Apr. 8, 2003.

(51) Int. Cl.
*G06F 15/00* (2006.01)
*H03M 13/03* (2006.01)
*H04L 5/12* (2006.01)

(52) U.S. Cl. .................... 708/492; 375/265; 714/792

(58) Field of Classification Search .......... 708/491–492
See application file for complete search history.

(56) References Cited

U.S. PATENT DOCUMENTS

| 4,949,294 | A | * | 8/1990 | Wambergue | 708/491 |
| 5,046,037 | A | * | 9/1991 | Cognault et al. | 708/492 |
| 5,768,309 | A | * | 6/1998 | Olafsson | 375/221 |
| 6,141,786 | A |  | 10/2000 | Cox et al. | |
| 6,230,179 | B1 |  | 5/2001 | Dworkin et al. | |
| 6,343,305 | B1 |  | 1/2002 | Koe et al. | |
| 6,587,864 | B2 |  | 7/2003 | Stein et al. | |
| 6,701,482 | B2 | * | 3/2004 | Salvi et al. | 714/786 |
| 7,020,826 | B2 | * | 3/2006 | Litwin et al. | 714/756 |
| 7,039,854 | B1 | * | 5/2006 | Ireland et al. | 708/492 |
| 7,269,615 | B2 | * | 9/2007 | Stein et al. | 708/492 |
| 2003/0103626 | A1 |  | 6/2003 | Stein et al. | |
| 2003/0115234 | A1 |  | 6/2003 | Stein et al. | |

FOREIGN PATENT DOCUMENTS

| EP | 0750401 A2 | 12/1996 |
| WO | WO 03/026137 | 3/2003 |

OTHER PUBLICATIONS

Meir et al., Error-Trellises for Convolutional Codes—Part I: Construction, Dec. 1998, IEEE Transactions on Communications, vol. 46, No. 12, pp. 1592-1601.*

(Continued)

*Primary Examiner*—Chuong D Ngo
(74) *Attorney, Agent, or Firm*—Goodwin Procter LLP

(57) ABSTRACT

A Galois field linear transformer trellis system includes a Galois field linear transformer matrix; an input selection circuit for providing to the matrix a number of input bits in one or more trellis bit streams and a trellis state output of the matrix and a programmable storage device for configuring the matrix to perform a multi-cycle Galois field transform of the one or more trellis bit steams and trellis state output to provide a plurality of trellis output channel symbols and a new trellis state output in a single cycle.

7 Claims, 10 Drawing Sheets

OTHER PUBLICATIONS

M'Sir, A. et al., "A high speed encoder for recursive systematic convolutive codes", Proc. 8$^{th}$ Internet, On-Line Testing Workshop, 2002, Piscataway, NJ, USA, IEEE, Jul. 8, 2002, pp. 51-55, XP010601405.

Anonymous: "Parallel Programmable Array Structured CR Generator, Oct. 1978", IBM Technical Disclosure Bulletin, vol. 21, No. 5, Oct. 1, 1978, pp. 2058-2059, XP002439386.

* cited by examiner

CHART I

| ADSL MODEM CLOCK CYCLE | s0 | s1 | s2 | s3 |
|---|---|---|---|---|
| 0 | s3 | $s0 + u2_0$ | s1 | $s1 + s2 + u1_0$ |
| 1 | $s1 + s2 + u1_0$ | $s3 + u2_1$ | $s0 + u2_0$ | $s0 + u2_0 + s1 + u1_1$ |
| 2 | $s0 + u2_0 + s1 + u1_1$ | $s1 + s2 + u1_0 + u2_2$ | $s3 + u2_1$ | $s3 + u2_1 + s0 + u2_0 + u1_2$ |
| 3 | $s3 + u2_1 + s0 + u2_0 + u1_2$ | $s0 + u2_0 + s1 + u1_1 + u2_3$ | $s1 + s2 + u1_0 + u2_2$ | $s1 + s2 + u1_0 + u2_2 + s3 + u2_1 + u1_3$ |
| 4 | $s1 + s2 + u1_0 + u2_2 + s3 + u2_1 + u1_3$ | $s3 + u2_1 + s0 + u2_0 + u1_2 + u2_4$ | $s0 + u2_0 + s1 + u1_1 + u2_3$ | $s0 + u2_0 + u1_1 + u2_3 + u1_0 + u2_2 + u1_4$ |
| 5 | $s0 + u2_0 + u1_1 + u2_3 + s2 + u1_0 + u2_2 + u1_4$ | $s1 + s2 + u1_0 + u2_2 + s3 + u2_1 + u1_3 + u2_5$ | $s3 + u2_1 + s0 + u2_0 + u1_2 + u2_4$ | $s1 + u1_1 + u2_3 + u1_2 + u2_4 + s1 + u2_4 + u1_5$ |
| 6 | $s1 + u1_1 + u2_3 + s3 + s2 + u1_2 + u2_4 + u1_3 + u1_5$ | $s0 + u2_0 + u1_1 + u2_3 + s2 + u1_0 + u2_2 + u1_3 + u2_5$ | $s1 + s2 + u1_0 + u2_2 + s3 + u2_1 + u1_3 + u2_5$ | $s0 + u2_0 + u1_2 + u2_3 + u2_4 + s1 + u1_3 + u2_5 + u1_6$ |
| 7 | $s0 + u2_0 + u1_2 + u2_3 + s1 + s2 + u1_0 + u2_2 + u1_3 + u2_4 + u2_5 + u1_6$ | $s1 + u1_1 + u2_3 + u2_4 + u1_2 + u2_4 + u1_5 + u2_7$ | $s0 + u2_0 + u1_1 + u2_3 + s2 + u1_0 + u2_2 + u1_4 + u2_6$ | $s0 + u2_0 + u1_1 + s3 + u2_1 + u1_3 + u2_5 + u1_7$ |

FIG. 2B

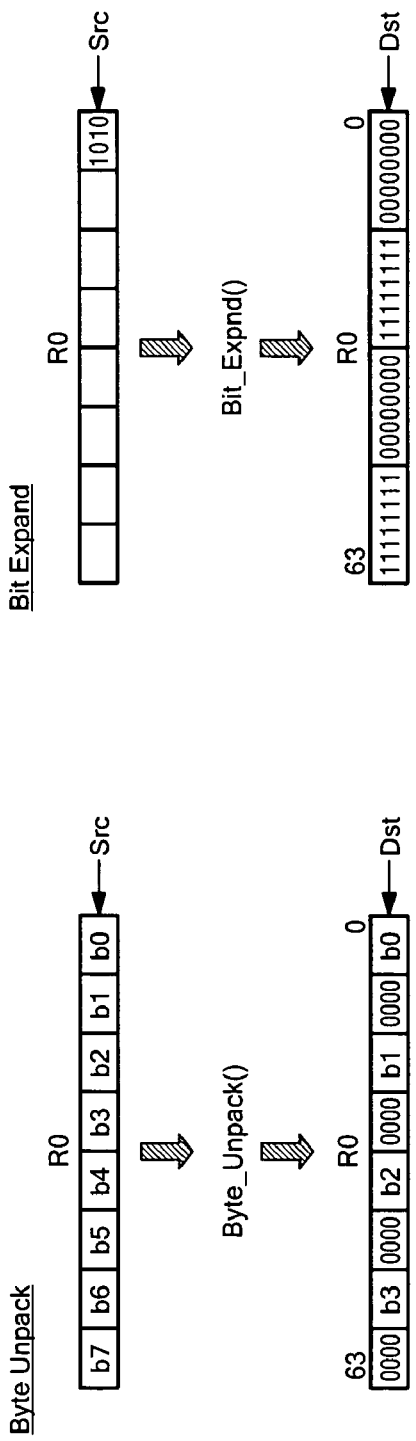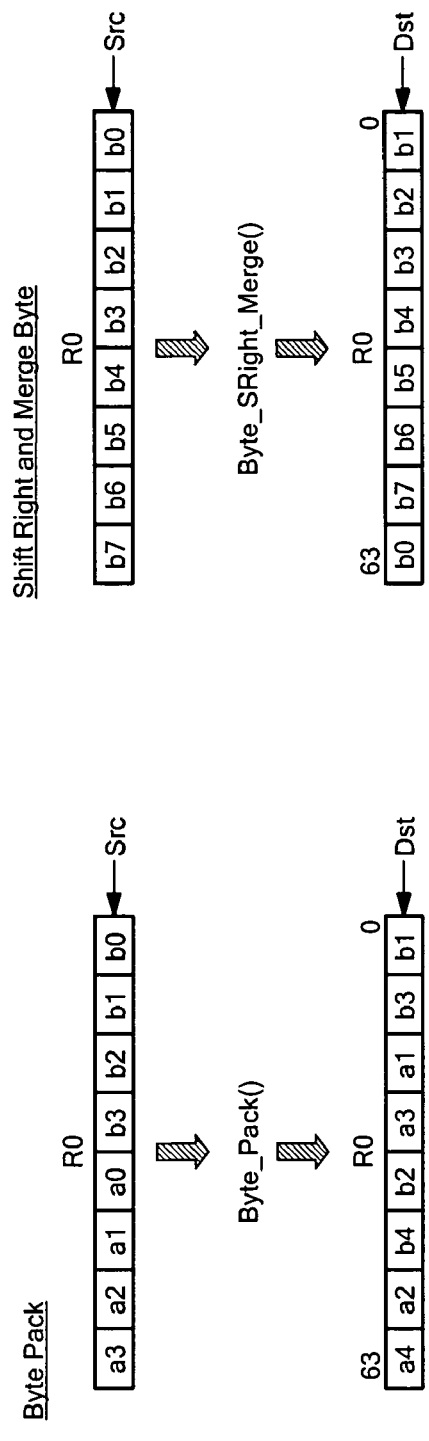

US 7,693,928 B2

GALOIS FIELD LINEAR TRANSFORMER TRELLIS SYSTEM

RELATED APPLICATIONS

This application claims priority of U.S. Provisional application Ser. No. 60/461,267, filed Apr. 8, 2003 to Stein et al. entitled A METHOD TO PREDICT TRELLIS OUTPUT USING THE GF-2 ALU.

FIELD OF THE INVENTION

This invention relates to an improved Galois field linear transformer trellis system, and more particularly to such a system which can perform a complete trellis operation with one or more bits and/or even output bit permutations in a single cycle.

BACKGROUND OF THE INVENTION

The purpose of forward error correction (FEC) is to improve the capacity of a channel by adding some carefully designed redundant information to the data being transmitted through the channel. The process of adding this redundant information is known as channel coding. Convolutional coding and block coding are the two major forms of channel coding. Convolutional codes operate on serial data, one or a few bits at a time. Block codes operate on relatively large (typically, up to a couple of hundred bytes) message blocks. In some occasions, convolutional code maybe more convenient than a block code, as it generates redundant bits and correct errors continuously. A trellis is a device used to encode bits by expanding them to introduce redundancy for error checking, for example. A trellis is made up of flip flops comprising the linear feedback shift register (LFSR) and exclusive OR gates comprising modulo two adders. Because of the LFSR, convolutional code has memory. For example, an input of two or three or more might produce an output of three or four or more channel symbols that are not only dependent on the current block of input bits but also on previous blocks. There are many different trellis systems that may need to be implemented: basic 1:2 encoders, basic 1:3 encoders or any basic n:m encoders. Trellis systems may be programmable or may involve hardware solutions. One problem with conventional programmable trellises is that they require several cycles of operation per bit to generate a channel symbol. The typical approach involves the implementation of a linear feedback shift register which requires numerous add or shift operations. Further, the channel bit generated may not be in the required order for subsequent processing. While hardware solutions may be more efficient for a specific function, they are not reconfigurable to accommodate the many different types of trellises that may be required.

BRIEF SUMMARY OF THE INVENTION

It is therefore an object of this invention to provide a Galois field linear transformer trellis system.

It is a further object of this invention to provide such a Galois field linear transformer trellis system which is faster, and can permute the channel symbol outputs to any desired order to accommodate subsequent processing.

It is a further object of this invention to provide such a Galois field linear transformer trellis system which can predict a plurality of output channel symbols from one or more bits in but a single cycle.

It is a further object of this invention to provide such a Galois field linear transformer trellis system which can in one cycle predict the output from a number of input bits in parallel.

It is a further object of this invention to provide such a Galois field linear transformer trellis system which additionally can be configured to perform a variety of independent input/output bit permutations.

The invention results from the realization that a much faster and simpler reconfigurable trellis system capable of receiving one or more bits in parallel and providing the output channel symbols in direct or permuted form can be achieved using a Galois field linear transformer matrix, an input selection circuit for providing to the matrix a number of input bits in one or more trellis bit streams and a trellis state output of the matrix and a programmable storage device for setting the matrix to perform a multi-cycle Galois field linear transform of the one or more trellis bit streams and trellis state output to provide a plurality of trellis output channel symbols, or even permuted trellis output channel symbols and a new trellis state in a single cycle.

This invention features a Galois field linear transformer trellis system including a Galois field linear transformer trellis matrix and an input selection circuit for providing to the matrix a number of input bits in one or more trellis bit streams and a trellis state output of the matrix. A programmable storage device configures the matrix to perform a multi-cycle Galois field linear transform of the one or more trellis bits streams and trellis state output to provide a plurality of trellis output channel symbols and a new trellis state output in a single cycle.

In a preferred embodiment the matrix may include a plurality of cells, each cell including an exclusive OR logic circuit an AND logic circuit having an output connected to the exclusive OR logic circuit and an input connected to the input selection circuit for receiving input bits. The programmable storage device may include a number of storage units each one programmed for enabling a different Galois field linear transformation. There may be a controller circuit for reconfiguring the programmable storage device to permute the trellis output channel symbols into a predetermined order. The controller circuit may also reconfigure the programmable storage device to enable only one cell in each row and column of the matrix for permuting a given input bit pattern to a different output bit pattern.

BRIEF DESCRIPTION OF THE DRAWINGS

Other objects, features and advantages will occur to those skilled in the art from the following description of a preferred embodiment and the accompanying drawings, in which:

FIG. 2B is a Chart I illustrating the four state conditions of the prior art ADSL Modem Trellis of FIG. 2A over eight clock cycles;

FIGS. 9A-H are schematic illustrations of samples of the permutations achievable with the reconfigurable Galois field linear transformer trellis system of this invention.

DISCLOSURE OF THE PREFERRED EMBODIMENT

Figure 1:
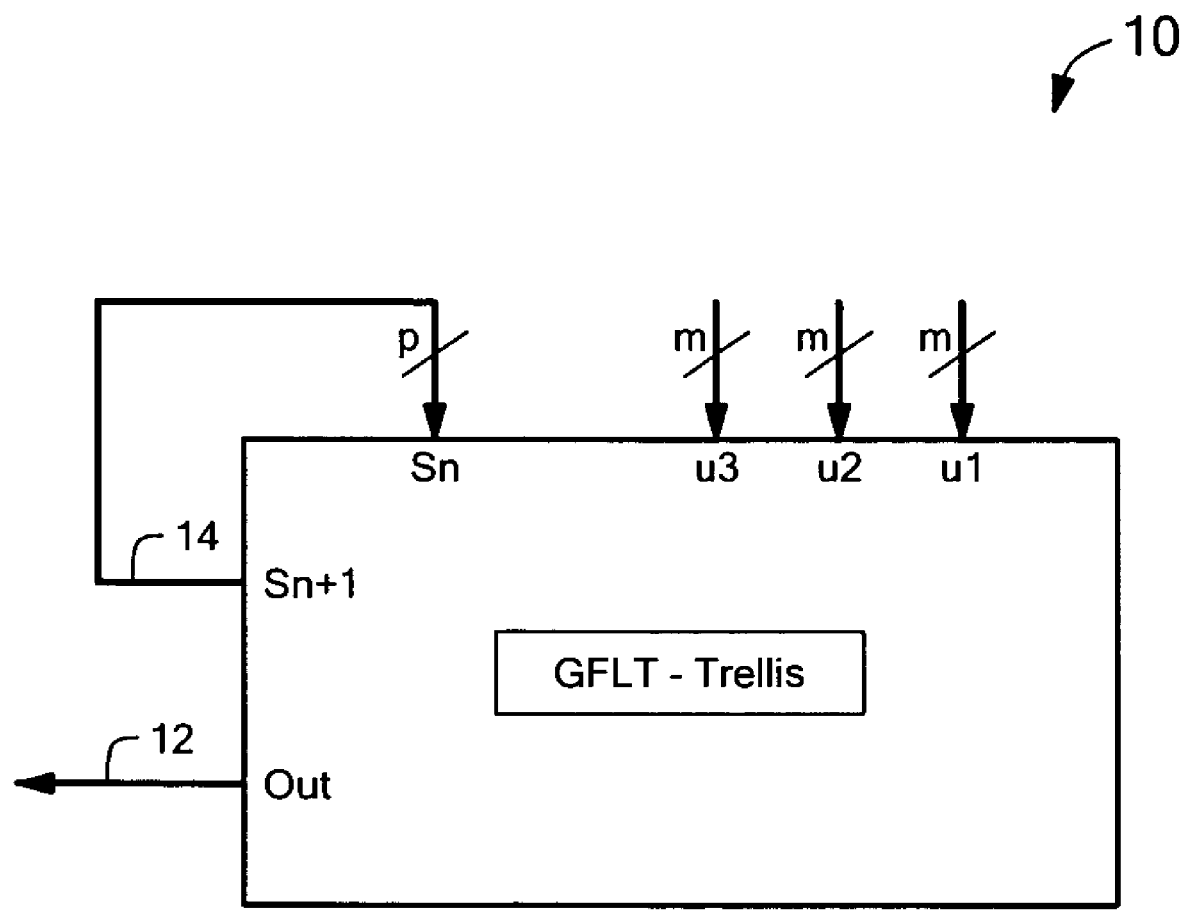
FIG. 1 is a simplified block diagram of a reconfigurable Galois field linear transformer trellis system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 a Galois field linear transformer trellis system 10 according to this invention which receives a number of input bits in one or more trellis bit streams designated generally as u3, u2 and u1 and a trellis state output of the matrix designated as Sn from which the system generates an output 12 and the next or new trellis state output 14 designated as Sn+1.

Figure 2A:
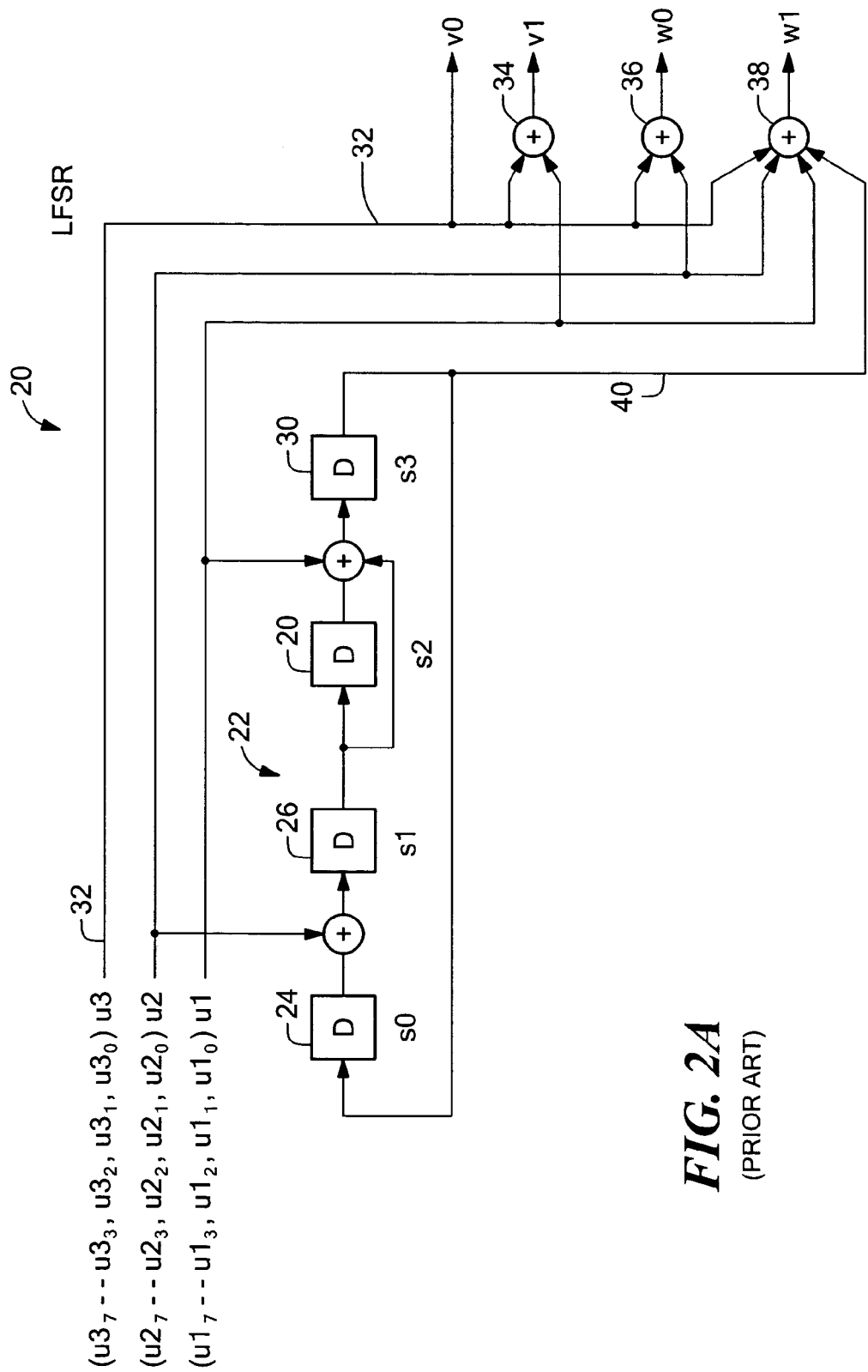
FIG. 2A is a schematic block diagram of a hardware linear feedback shift register implementation of a typical prior art ADSL Modem trellis system.

There is shown in FIG. 2A a typical trellis system such as in ADSL Modem Trellis 20 implemented in hardware as a linear feedback shift register (LFSR) 22. Linear feedback shift register 22 includes four storage devices, flip-flop 24, 26, 28 and 30, which represent the states s0, s1, s2, and s3 of the linear feedback shift register. Trellis bit streams u3, u2, and u1 appear at the inputs 32 as a stream of bits $u3_0$, $u3_1$, $u3_2$, $u3_3 \ldots u3_7 \ldots$, $u2_0$, $u2_1$, $u2_2$, $u2_3 \ldots u2_7 \ldots$, $u1_0$, $u1_1$, $u1_2$, $u1_3 \ldots u1_7 \ldots$ The bit stream u3 provides the output v0 directly at input 32. The output v1 is produced by exclusive OR gate 34 in response to the u3 input and u1 input. Output w0 is produced by exclusive OR gate 36 in response to the u3 and u2 inputs. The output w1 is provided by exclusive OR gate 38 in response to all of the inputs, u3, u2, u1 plus the output state s3 of linear feedback shift register 22 on line 40. While trellis system 20 does perform its operations quickly to obtain outputs v0, v1, w0, w1 in response to the various specific trellis input bits $u3_0$, $u3_1$, $u3_2$, $u3_3 \ldots u3_7 \ldots$, $u2_0$, $u2_1$, $u2_2$, $u2_3 \ldots u2_7 \ldots$, $u1_0$, $u1_1$, $u1_2$, $u1_3 \ldots u1_7 \ldots$, represented generally as u3, u2, and u1, it suffers from the shortcoming that is it hardwire dedicated to serving the ADSL modem trellis function and cannot be easily reconfigured for any other purpose.

In operation, at each cycle of the clock, column 50, FIG. 2B, the states s0, s1, s2, and s3 will be as shown in Chart II.

Figure 3A:
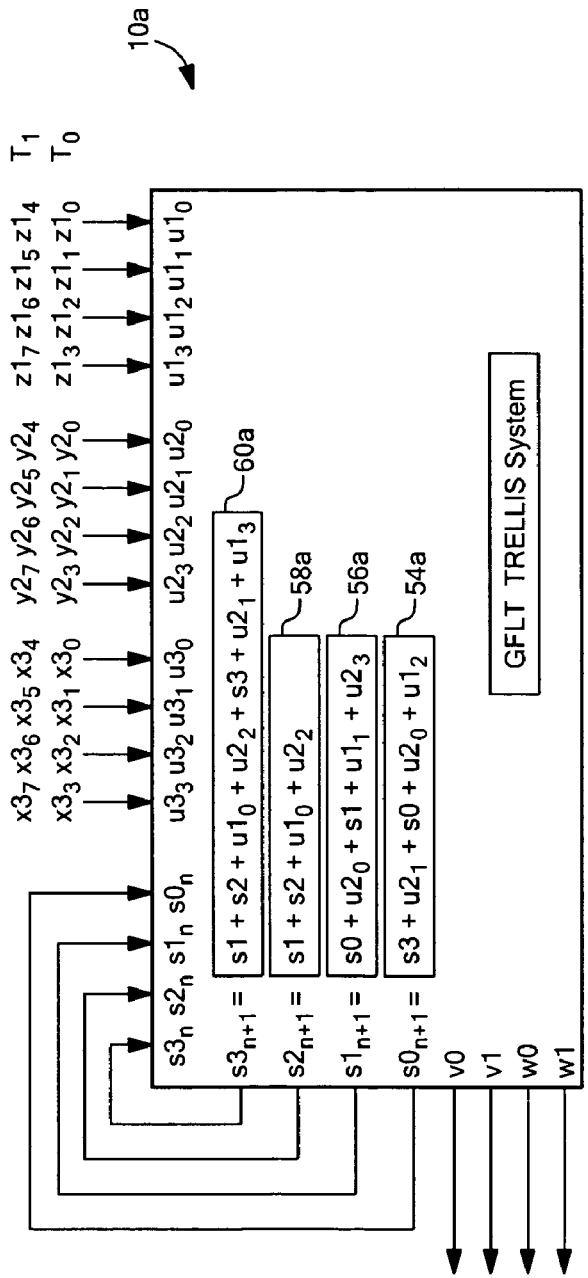
FIG. 3A is a more detailed schematic block diagram of the reconfigurable Galois field linear transformer trellis system of FIG. 1.

While trellis 20, FIG. 2A, is dedicated to performing the function of a particular trellis, in this case an ADSL modem trellis, and can process only single bit at a time, the Galois field linear transformer trellis system 10a of this invention, FIG. 3A, can process four, eight twelve, sixteen or any number of bits simultaneously depending upon the size of the Galois field linear transformer matrix that is acceptable in a particular application. This is shown in FIG. 3A, where the generalized trellis bit stream inputs $u1_0$-$u1_3$, $u2_0$-$u2_3$, $u3_0$-$u3_3$, are shown all accepted simultaneously. The specific bits are shown for first tick or clock cycle as $z1_0$, to $z1_3$, $y2_0$ through $y2_3$ and $x3_0$ through $x3_3$. Since in this particular example GFLT trellis system 10 is accepting four bits at a time, its output in true Galois field transformer form will present the output corresponding to the fourth clock cycle or clock cycle number three in Chart I highlighted in the boxed area 52 of Chart I, FIG. 2B. These values for states s0, s1, s2, and s3, shown at 54, 56, 58, and 60 in Chart I, FIG. 2B, are thus the new trellis states, 54a 56a, 58a, and 60a, FIG. 3A. They are the new trellis states, $s0_{n+1}$, $s1_{n+1}$, $s2_{n+1}$, $s3_{n+1}$ and are fed back to the trellis inputs $s3_n$, $s2_n$, $s1_n$, $s0_n$. Thus the first tick or clock cycle of the Galois field linear transformer trellis system according to this invention produces the same output as the fourth clock cycle or clock cycle number 3 of the prior art system 20. Thus in one cycle not one, but four (or eight or twelve or any other number), bits are processed. This is compared to the several cycles that would be required to accomplish this in any other software, reconfigurable, system.

Figure 3B:
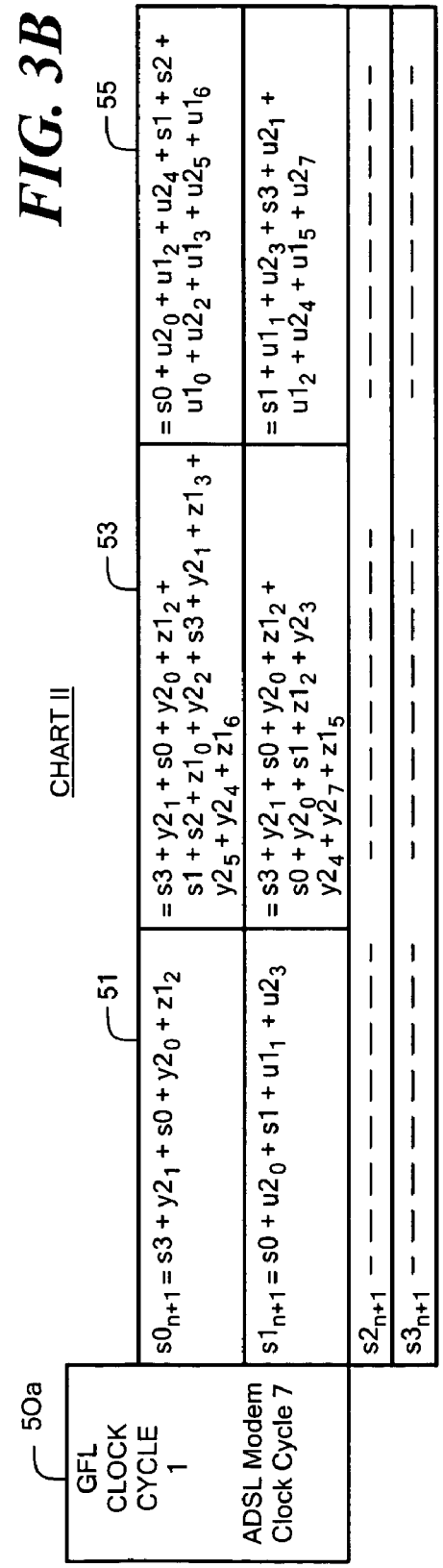
FIG. 3B illustrates two of the four state conditions occurring in the Galois field linear transformer trellis system of FIG. 3A.

On the next or second clock cycle designated clock cycle, 0, Chart II, FIG. 3B, state $s0_{n+1}$ is shown in column 51 as, the exclusive OR combination of s3, $y2_1$ ($y2_1$ is the present value of $u2_1$), s0, $y2_0$, ($y2_0$ is the present value of $u2_0$), and $z1_2$, ($z1_2$ is the present value of $u1_2$). This can be expanded as shown in the second column 53 and then have redundancy eliminated (modulo two addition) as shown in the third column 55 to provide the next trellis state, the same thing can be done for $S1_{n+1}$, $s2_{n+1}$, and $s3_{n+1}$. The outputs v0, v1, w0 and w1 are not tabulated in chart form as they are straightforward exclusive OR combinations of the signals, as shown for example, on the Galois field linear transform trellis system matrix 60, FIG. 4. There it can be seen that by enabling the exclusive OR gate cells 62 at selected junctions of the rows and columns of matrix 60 the outputs required in Charts I, and II are obtained. For example, referring to Chart II, FIG. 3B, the value of s3 can be seen as the exclusive OR combination of s1, s2, s3, $u2_1$, $u2_2$, $u1_3$ and $u1_0$, for $w0_3$, for example, the expression would be simply $u3_3$ and $u2_3$ exclusively Ored; for $v1_2$ it would be $u3_2$ and $u1_2$ exclusively ORed and so on. Thus in one simple cycle of operation, four bits can be processed to provide the output and the states which normally would take four cycles in a hardware implementation such a shown in the ADSL modem trellis of FIG. 2A, and many many more cycles of operation in a reconfigurable software implementation.

Figure 4:
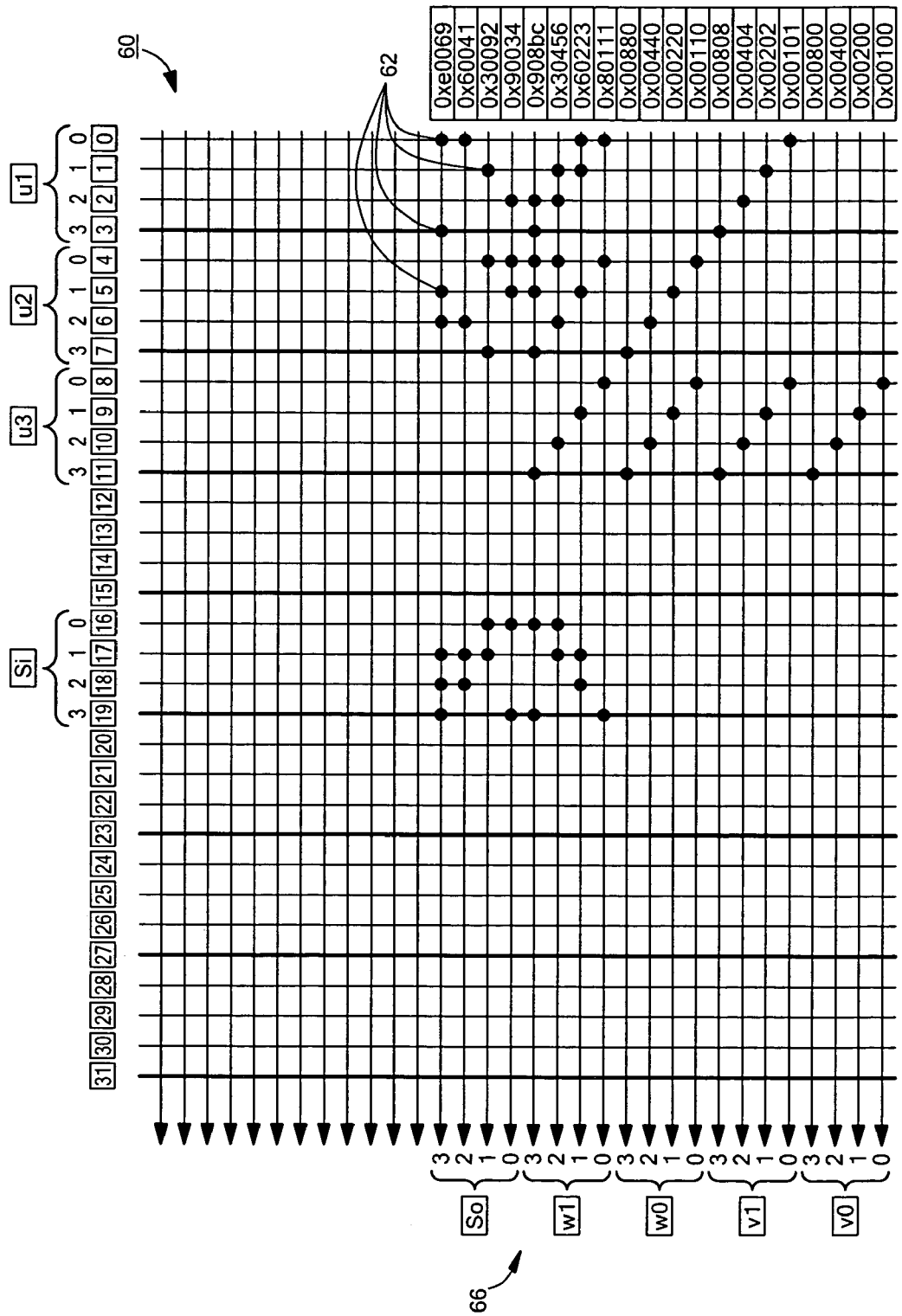
FIG. 4 is a more detailed schematic diagram of the Galois field linear transformer matrix of FIG. 3 configured to produce the trellis output channel symbols from the input bits in one cycle.
Figure 5:
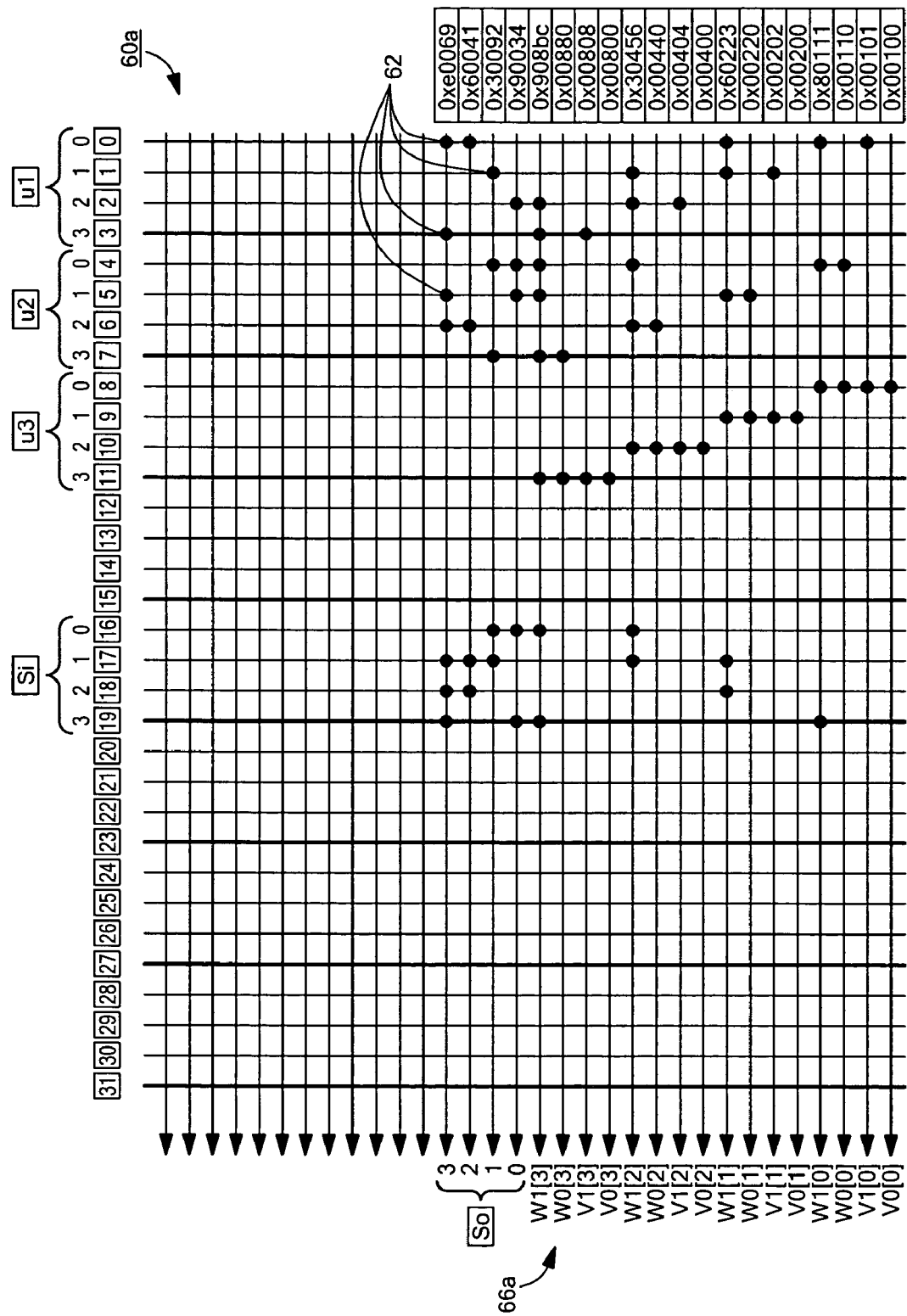
FIG. 5 is a schematic diagram of the Galois field linear transformer matrix of FIG. 3 reconfigured to produce the trellis output channel symbols permuted with respect to the input bits in one cycle.

A further advantage of this invention is the facility of the matrix to manipulate the outputs in any desired order so that they can be assembled in the form required for trellis output channel symbols. For, example, instead of the output after the single cycle being presented as shown in FIG. 4, where all the w1's, 0 through 3 are grouped; all the w0's 0 through 3, all v1's and all the v0's are grouped, there could instead be a grouping wherein the w1[3], w0[3], v1[3], v0[3] are grouped, w1[2], w0[2], v1[2], v0[2] are grouped and so on as shown in FIG. 5.

Figure 6:
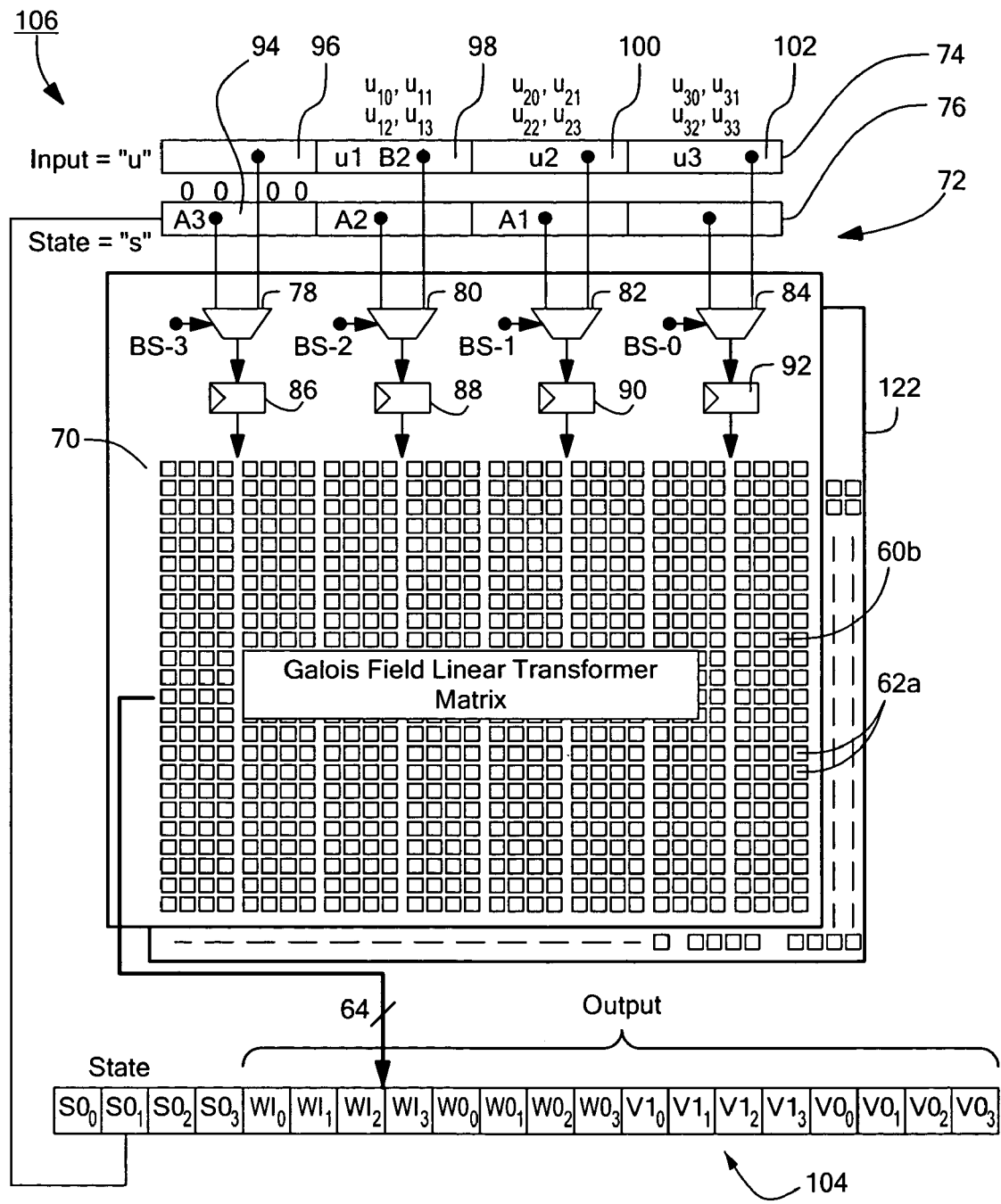
FIG. 6 is a more detailed schematic block diagram of the Galois field linear transformer trellis system of FIG. 3.

The Galois field linear transformer trellis system 10b, FIG. 6, may include matrix 70 and input selection circuit 72, which may include input or "u" register 74, state or "s" register 76, a number of mux's 78, 80, 82, 84 and a corresponding number of latches 86, 88, 90, 92. Initially all of the inputs at stage 94 of register 76 are zero as all of the states "s" are zero. There are no trellis bit stream bits in the first stage 96 of input register 74, but the previously identified trellis bit stream bits are present: bits $u1_0$, $u1_1$, $u1_2$, $u1_3$, in stage 98; bits $u2_0$, $u2_1$, $u2_2$, $u2_3$ in stage 100; and bits $u3_0$, $u3_1$, $u3_2$, $u3_3$ in stage 102.

Figure 7:
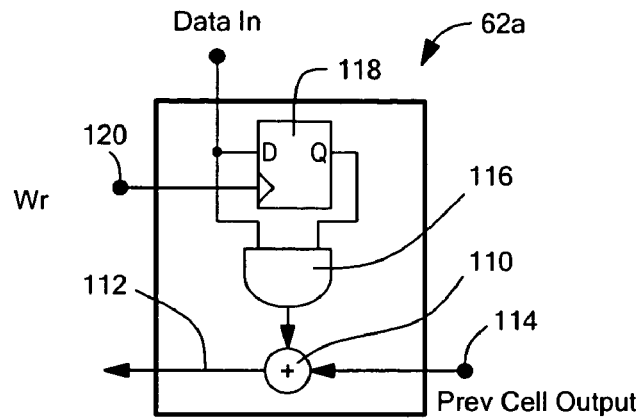
FIG. 7 is a schematic diagram of a cell of the matrix with a programmable storage device.

When these are presented along with the zero states in stage 94, register 76 Galois field linear transformer matrix 60b immediately, in one cycle, predicts the outcome and produces it in output register 104. The state conditions $s0_0, s0_1, s0_2, s0_3$ are also resident now in output register 104 and are fed back to stage 94 of state register 76 and the next set of four bits each is processed along with it to provide the next output in output register 104 to perform the operations as explained with respect to FIGS. 3A, B, 4 and 5. Each cell 62a, FIG. 7, may include an exclusive OR gate 110 whose output 112 is connected to the next cell and whose input 114 is connected to the output from the previous cell, except for the first cell in a row whose input is connected to zero and last cell in each row whose output represents the output of the matrix. AND gate 116 provides the other input to exclusive OR gate 110 and a programmable storage device, flip flop 118, responds to a write signal on line 120 and controls the disablement of AND gate 116 and thus the enablement of cell 62a. Each of the programmable storage cells or flip flops 118 may be implemented independently of the remainder of the cell on a separate plane 122 as shown in FIG. 6. The control circuit then simply addresses the programmable plane 122 of flip flops to configure or reconfigure the matrix to serve any particular trellis implementation.

Figure 8:
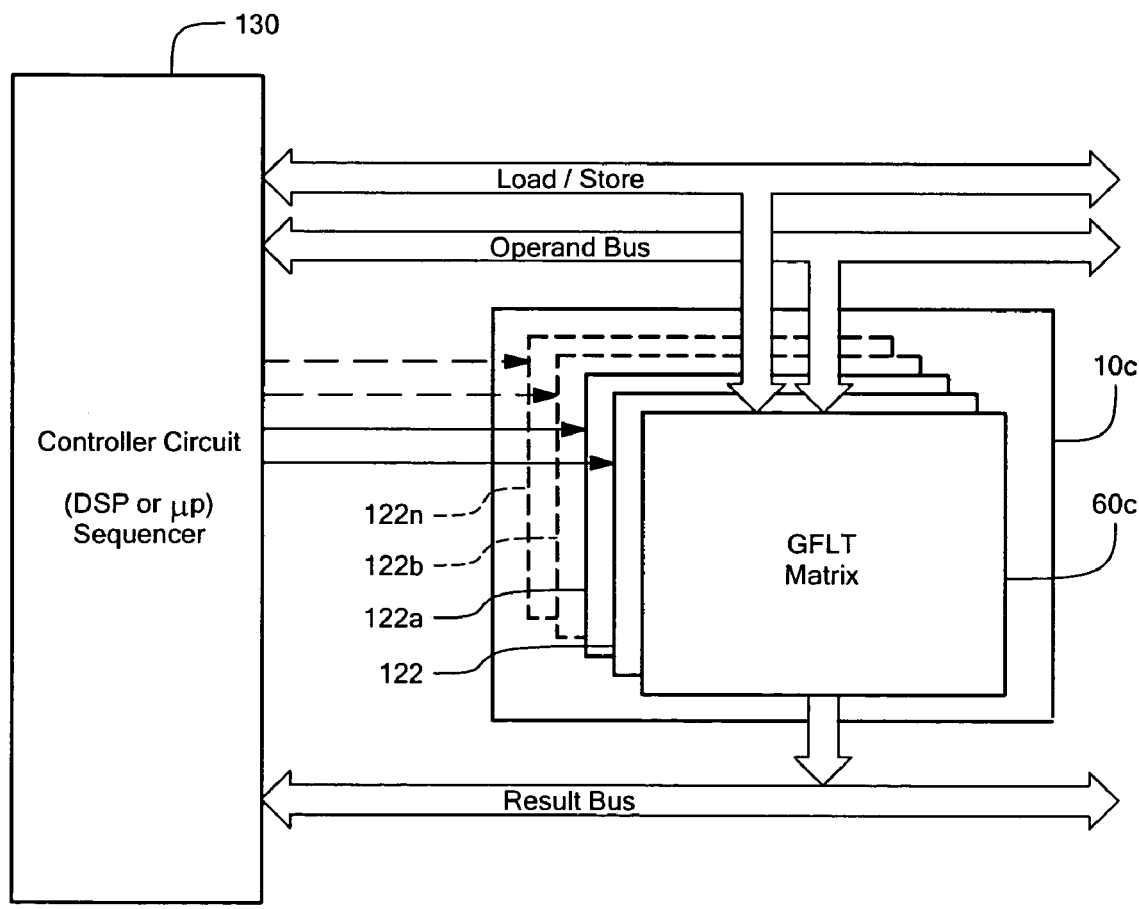
FIG. 8 is a schematic block diagram of the Galois field linear transformer trellis system of this invention with a plurality of planes of programmable devices and a controller circuit for configuring and reconfiguring it.
Figure 9B:
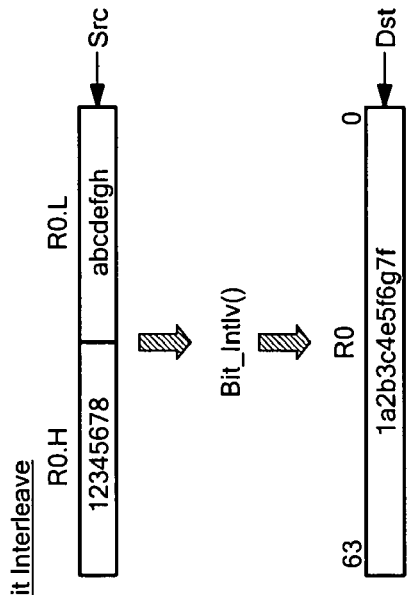
Figure 9D:
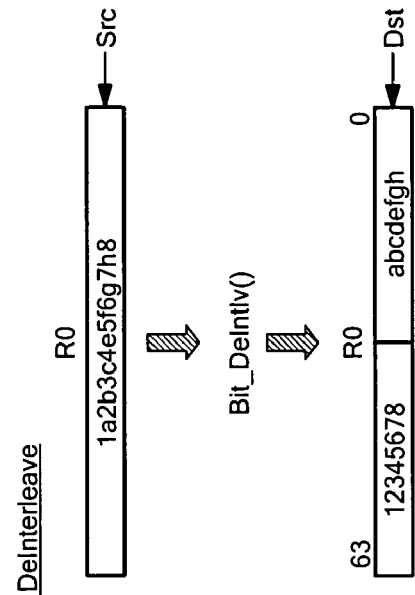
Figure 9A:
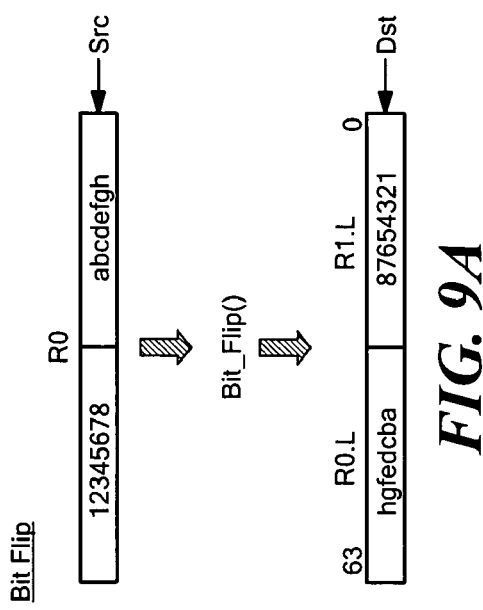
Figure 9C:
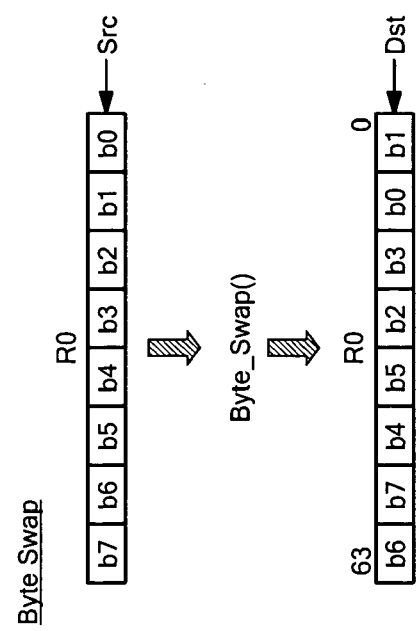

This is shown diagrammatically in FIG. 8, where controller circuit 130, for example a DSP, or microprocessor, or sequencer controls one or more storage planes 122, 122a, 122b, 122n. The construction of the Galois field linear transformer and attendant circuitry is shown in U.S. Pat. No. 3,658,864, which is incorporated in its entirety herein by this reference. The programming of the programmable storage devices 122, 122a, 122a, 122b . . . 122n is not limited to only reconfiguring the matrix for different trellis operations but may also reconfigure it in between trellis operations, for example, to perform various permutations between the trellis input bit stream and the trellis output channel symbols. There are two permutation types which are achieved by reconfiguring the enabled cells 62 of the matrix 60. The first type involves a permutation where the number of input and output bits are equal. In that case only one cell is enabled in each row and column of the matrix. The second involves a permutation where there are more output then input bits (expand). In that case only one cell is enabled in each row of the matrix. Typical permutations of the two types are shown in FIGS. 9A-9H, where FIG. 9A represents a Bit Flip permutation, FIG. 9B, a Bit Interleave permutation, FIG. 9C a Byte Swap, FIG. 9D a Bit DeInterleave, FIG. 9E a Byte Unpack, FIG. 9F a Bit Expand, FIG. 9G a Byte Pack and FIG. 9H a Shift Right and Merge Byte.

The following cases are incorporated herein in their entirety by this reference: U.S. patent application Ser. No. 10/051,533 filed Jan. 18, 2002 to Stein et al., entitled GALOIS FIELD LINEAR TRANSFORMER (AD-239J); U.S. patent application Ser. No. 10/170,267, filed Jun. 12, 2002 to Stein et al., entitled PROGRAMMABLE DATA ENCRYPTION ENGINE (AD297J); U.S. patent application Ser. No. 10/136,170, filed May 1, 2002 to Stein et al., entitled RECONFIGURABLE INPUT GALOIS FIELD LINEAR TRANSFORMER SYSTEM (AD-300J).

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A Galois field linear transformer (GFLT) trellis system comprising:
 a GFLT matrix comprising an array of cells, wherein, except for the first and last cells in each row of said array, each cell includes;
  (1) an exclusive OR logic circuit having an output coupled to a next cell and a first input coupled to the output of a previous cell,
  (2) an AND logic circuit having an output connected to a second input of said exclusive OR logic circuit and an input connected to one of a number of input bits, and
  (3) a programmable storage device responsive to a write signal to disable said AND logic circuit to thereby enable said each cell;
 an input selection circuit for providing to said matrix said number of input bits in one or more trellis bit streams and feeding back to said matrix an trellis state output of said matrix; and
 wherein said matrix is reconfigurable by enabling or disabling cells in said array, thereby causing enabled cells collectively to implement a programmed algorithm of a multi-cycle Galois field transform of said one or more trellis bit streams and trellis state output to provide a plurality of trellis output channel symbols and new trellis state output in a single clock cycle for providing modulation in forward error correction.

2. The Galois field linear transformer trellis system of claim 1 in which said programmable storage devices collectively form one or more storage planes programmed for enabling different algorithms of Galois field transformation.

3. The Galois field linear transformer trellis system of claim 1 including a controller circuit for reconfiguring said matrix to permute said trellis output channel symbols into a predetermined order.

4. The Galois field linear transformer trellis system of claim 1 including a controller circuit for reconfiguring said matrix to enable only one cell in each row and column of said matrix for permuting a given input bit pattern to a different output bit pattern.

5. The Galois field linear transformer trellis system of claim 1 in which said input selection circuit includes an input register, a state register and a switching system circuit for selectively inputting data from one or both of said input registers and state register to said matrix.

6. The Galois field linear transformer trellis system of claim 1 including a controller circuit for reconfiguring said matrix to enable only one cell in each row of said matrix for expanding a given input bit pattern to a different output bit pattern.

7. A Galois field linear transformer (GFLT) trellis system comprising:
 a GFLT matrix comprising an array of cells, wherein, except for first and last cells in each row of said array, each cell includes:
  (1) an exclusive OR logic circuit having an output coupled to a next cell and a first input coupled to the output of a previous cell,
  (2) an AND logic circuit having an output connected to a second input of said exclusive OR logic circuit and an input connected to one of a number of input bits, and (3) a programmable storage device responsive to a write signal to disable said AND logic circuit to thereby enable said each cell;

an input selection circuit for providing to said matrix a number of input bits, in one or more trellis bit screams and feeding back to said matrix an trellis slate output of said matrix; and wherein said matrix is reconfigurable by enabling or disabling cells in said array, thereby causing enabled cells collectively to implement a programmed algorithm of a multi-cycle Galois field transform of said one or more trellis bit streams and trellis state output to provide a plurality of permuted trellis output channel symbols and new trellis state output in a single clock cycle for providing modulation in forward error correction.

* * * * *